United States Patent
Bhakta

(10) Patent No.: US 10,458,612 B2
(45) Date of Patent: *Oct. 29, 2019

(54) APPARATUS HAVING BLUE LIGHT SOURCE, DICHROIC MIRROR AND PHOSPHOR CONVERTER TO GENERATE WHITE LIGHT

(71) Applicant: TEXAS INSTRUMENTS INCORPORATED, Dallas, TX (US)

(72) Inventor: Vikrant R. Bhakta, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/850,698

(22) Filed: Dec. 21, 2017

(65) Prior Publication Data

US 2018/0135823 A1    May 17, 2018

Related U.S. Application Data

(63) Continuation of application No. 14/752,738, filed on Jun. 26, 2015, now Pat. No. 9,869,442.

(Continued)

(51) Int. Cl.
*F21S 41/16* (2018.01)
*F21S 41/14* (2018.01)
(Continued)

(52) U.S. Cl.
CPC .............. *F21S 41/16* (2018.01); *F21S 41/14* (2018.01); *F21S 41/143* (2018.01);
(Continued)

(58) Field of Classification Search
CPC ........ F21K 9/64; F21S 48/1145; H01S 5/005; G03B 21/204
See application file for complete search history.

(56) References Cited

U.S. PATENT DOCUMENTS 9,255,691 B2   2/2016  Motoya et al.
9,435,503 B2   9/2016  Masuda et al.
(Continued)

OTHER PUBLICATIONS

J. Schug et al, "Dedicated Phosphor Developments for Future Laser Based Headlights", Vision 2014, Proceedings of Vision 2014 Conference, Societe des Ingenieurs de L'Automobile, Versailles, France, Oct. 2014, pp. 1-8 Oct. 14-15, 2014, Versailles, France, pp. 1-8.

(Continued)

*Primary Examiner* — Robert J May
(74) *Attorney, Agent, or Firm* — Michael A. Davis, Jr.; Charles A. Brill; Frank D. Cimino

(57) ABSTRACT

An illumination apparatus is provided that includes a yellow phosphor converter to receive a blue laser light beam and to convert a portion of the blue laser light beam to yellow light, a dichroic mirror optically coupled to the yellow phosphor converter to receive the phosphor-emitted light beam and to filter the phosphor-emitted light beam to provide a dichroic-filtered light beam, the dichroic mirror configured to pass yellow light and to reflect at least some blue light, and a blue light source optically coupled to the dichroic mirror to provide a blue light beam, the dichroic mirror configured to reflect the blue light beam in a same direction as the dichroic-filtered light beam.

15 Claims, 7 Drawing Sheets

Related U.S. Application Data

(60) Provisional application No. 62/017,459, filed on Jun. 26, 2014.

(51) Int. Cl.

| | | |
|---|---|---|
| *F21S 41/147* | (2018.01) | |
| *F21S 41/143* | (2018.01) | |
| *F21S 41/64* | (2018.01) | |
| *F21S 41/675* | (2018.01) | |
| *G03B 21/20* | (2006.01) | |
| *H01S 5/00* | (2006.01) | |
| *F21S 41/33* | (2018.01) | |
| *F21S 41/36* | (2018.01) | |
| *F21S 41/32* | (2018.01) | |
| *F21S 41/30* | (2018.01) | |
| *F21S 41/173* | (2018.01) | |
| *F21S 41/265* | (2018.01) | |
| *F21S 41/255* | (2018.01) | |
| *F21S 41/176* | (2018.01) | |

(52) U.S. Cl.
CPC ........... *F21S 41/147* (2018.01); *F21S 41/173* (2018.01); *F21S 41/265* (2018.01); *F21S 41/30* (2018.01); *F21S 41/32* (2018.01); *F21S 41/33* (2018.01); *F21S 41/36* (2018.01); *F21S 41/645* (2018.01); *F21S 41/675* (2018.01); *G03B 21/204* (2013.01); *H01S 5/005* (2013.01); *H01S 5/0071* (2013.01); *F21S 41/176* (2018.01); *F21S 41/255* (2018.01)

(56) References Cited

U.S. PATENT DOCUMENTS

| | | |
|---|---|---|
| 2013/0329448 A1 | 12/2013 | Franz et al. |
| 2014/0071706 A1 | 3/2014 | Yagi et al. |
| 2015/0124468 A1 | 5/2015 | Reiners |
| 2015/0267880 A1 | 9/2015 | Hadrath et al. |
| 2016/0187644 A1 | 6/2016 | Bhakta |
| 2016/0191869 A1 | 6/2016 | Bhakta |
| 2016/0223892 A1 | 8/2016 | Takahashi et al. |

OTHER PUBLICATIONS

A. Gunther, "Optical Concept for an Active Headlamp with a DMD Array", SPIE Proceedings, vol. 7003, Optical Sensors 2008, 70032D, Apr. 28, 2008, pp. 1-8.

Carsten Gut and Stephan Berlitz, "Laser Headlamp; Experiences in Motor Sports for Series Development", Proceedings of Vision 2014 Conference, Societe des Ingenieurs de L'Automobile, Versailles, France, Oct., 2014, pp. 1-5.

Lawrence Ulrich, "BMW Laser Headlights Slice Through the Dark", IEEE Spectrum, posted on Oct. 25, 2013, available at http://spectrum.ieee.org/transportation/advanced-cars/bmw-laser-headlights-slice-through-the-dark, pp. 1-5.

APPARATUS HAVING BLUE LIGHT SOURCE, DICHROIC MIRROR AND PHOSPHOR CONVERTER TO GENERATE WHITE LIGHT

CROSS-REFERENCE TO RELATED APPLICATIONS

This application is a continuation of U.S. patent application Ser. No. 14/752,738 filed Jun. 26, 2015, which claims benefit of priority to U.S. Provisional Patent Application Ser. No. 62/017,459, filed Jun. 26, 2014, both of which are incorporated herein by reference in their entirety.

BACKGROUND

This relates generally to illumination for headlamps, and more particularly to hybrid illumination for headlamps.

Laser based headlamp systems are currently being used in or are planned for some high end automobiles, e.g., automobiles made by Audi and BMW, and are likely to appear in more models in the future. The high beam setting for such systems may have twice the light range and three times the luminosity of light emitting diode (LED) headlamp systems. The safety of using such headlamps is of concern due to the use of the laser technology. Accordingly, improvements in the safety of such headlamp systems are desirable.

SUMMARY

Embodiments relate to methods and apparatus for hybrid illumination. In one aspect, an illumination apparatus is provided that includes a yellow phosphor converter to receive a blue laser light beam and to convert a portion of the blue laser light beam to yellow light, a dichroic mirror optically coupled to the yellow phosphor converter to receive the phosphor-emitted light beam and to filter the phosphor-emitted light beam to provide a dichroic-filtered light beam, the dichroic mirror configured to pass yellow light and to reflect at least some blue light, and a blue light source optically coupled to the dichroic mirror to provide a blue light beam, the dichroic mirror configured to reflect the blue light beam in a same direction as the dichroic-filtered light beam.

In one aspect, a headlamp is provided that includes a hybrid illumination system to provide a white light beam, a spatial light modulator to modulate the white light beam at a pixel level to generate an image, illumination optics optically coupled to the hybrid illumination system to receive and arrange the white light beam to illuminate the spatial light modulator; and projection optics optically coupled to the spatial light modulator to receive the image, map pixels of the image to pixels of a larger image, and project the larger image at a distance away from the headlamp.

In one aspect, a method for generating a white light beam in an illumination apparatus is provided that includes exciting a yellow phosphor converter included in the illumination apparatus with a blue laser light beam to generate a phosphor-emitted light beam, the phosphor-emitted light beam including yellow light converted from at least a portion of the blue laser light beam, passing the phosphor-emitted light though a dichroic mirror in the illumination apparatus to provide a dichroic-filtered light beam, the dichroic mirror configured to pass yellow light and to reflect at least some blue light, and reflecting a blue light beam from the dichroic mirror in a same direction as the dichroic-filtered light beam.

BRIEF DESCRIPTION OF THE DRAWINGS

Particular embodiments will now be described, by way of example only, and with reference to the accompanying drawings.

DETAILED DESCRIPTION OF EXAMPLE EMBODIMENTS

Figure 1:
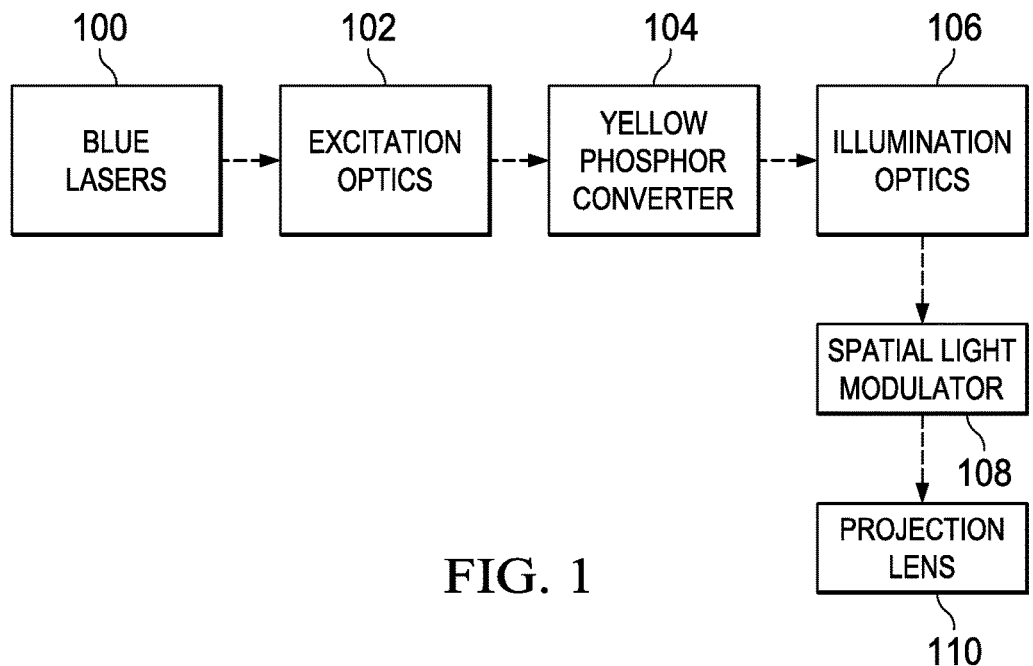
FIG. 1 shows an example high level architecture for a laser based headlamp.

Specific embodiments of the disclosure will now be described in detail with reference to the accompanying figures. Like elements in the various figures are denoted by like reference numerals for consistency.

FIG. 1 shows an example high level architecture for a laser based headlamp. One or more blue lasers 100 are optically coupled to excitation optics 102 to provide blue light. The blue light is collected and collimated by the excitation optics 102 to generate a blue excitation beam. The blue excitation beam is then passed via an optical connection to the yellow phosphor converter 104. The yellow phosphor converter 104, which may be either reflective or transmissive, converts some of the blue excitation beam to yellow and some remains blue. In general, in a reflective phosphor, phosphor material is coated on a reflective substrate such as for, example, copper, aluminum or mirror. In general, in a transmissive phosphor, phosphor material is coated on a transmissive substrate such as glass or may be sandwiched between two glass plates. Additional information about reflective and transmissive phosphors may be found, for example, J. Schug, et. al., "Dedicated Phosphor Developments for Future Laser Based Headlights," Proceedings of Vision 2014 Conference, Societe des Ingenieurs de L'Automobile, Versailles, France, October, 2014, pp. 1-8, "Schug" herein.

The net result of the interaction of the blue excitation beam with the yellow phosphor converter 104 is a white light beam. The white light beam is provided to illumination optics 106 optically coupled to the yellow phosphor plate 104. The illumination optics 106 arrange the white light beam to properly illuminate the optically coupled spatial light modulator 108. The spatial light modulator 108 amplitude modulates the white light beam at the pixel level to generate a white image that is communicated to the optically coupled projection lens 110. The projection lens 110, which is an imaging projection lens, captures the reflected image and projects a larger image at some distance away. In general, an imaging projection lens magnifies the image and projects the magnified image on a surface at some distance. In this example, one pixel of the reflected image is mapped to one magnified pixel, i.e., a one-to-one mapping.

Any suitable combination of illumination optics 106 and spatial light modulator 108 may be used. In general, the type of illumination optics used depends on the type of spatial light modulator used. For example, the spatial light modulator 108 may be a digital micromirror device (DMD) and the illumination optics 106 may be a single biconic lens that focuses the collimated white light on the DMD. In another example, the spatial light modulator 108 may be a liquid crystal on silicon (LCOS) spatial light modulator and the illumination optics 106 may include a polarization conversion system and a polarizing beam splitter. In another example, the spatial modulator 108 may be a liquid crystal display (LCD) spatial light modulator and the illumination optics 106 may include a polarization conversion system.

Figure 2:
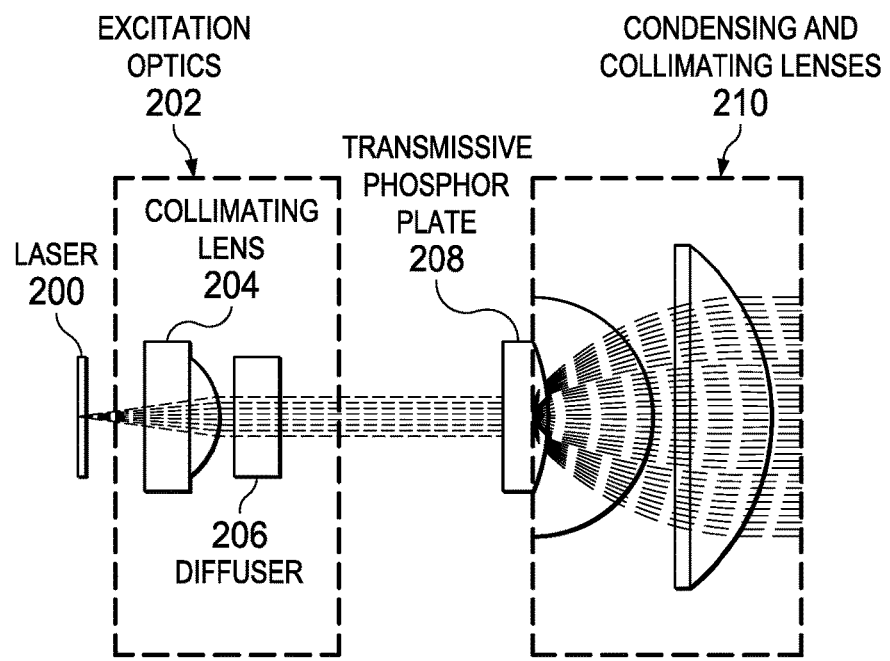
FIG. 2 is an example illumination system for a laser based headlamp that includes a transmissive yellow phosphor plate.
Figure 3:
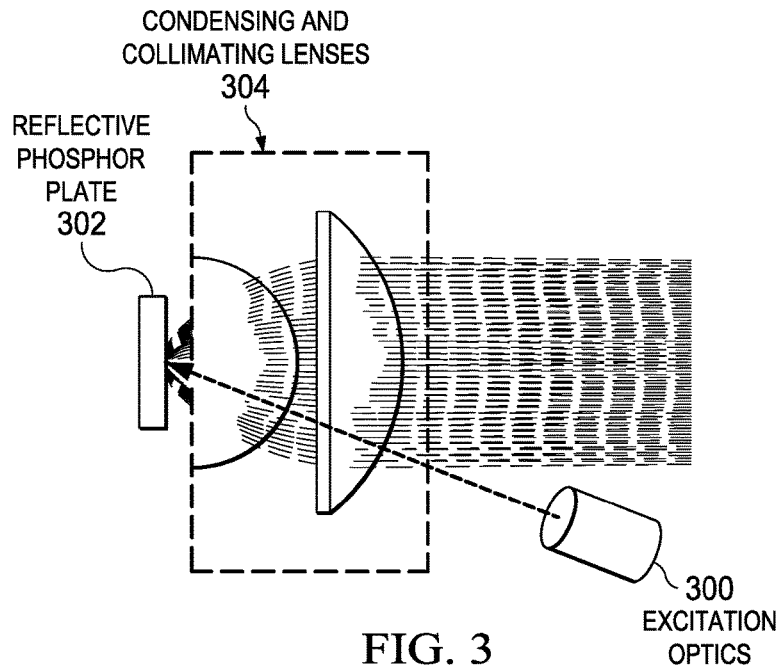
FIG. 3 is an example illumination system for a laser based headlamp that includes a reflective yellow phosphor plate.

FIG. 2 and FIG. 3 are example illumination systems that may be used in the laser based headlamp architecture of FIG. 1. Referring first to the example of FIG. 2, a blue laser diode 200 is optically coupled to excitation optics 202 to provide a blue laser light beam. The blue laser light beam is collected and collimated and shaped by the excitation optics 202 to generate a blue excitation beam. The excitation optics 202 include a collimating lens 204 which receives and collimates the blue laser light emitted by the laser diode(s) 200. The excitation optics 202 further include a beam shaper 206 implemented by an optical diffuser optically coupled to the collimating lens 204. The optical diffuser 206 receives collimated blue laser light from the collimating lens 204 and optically homogenizes the collimated blue laser light into a top hat spatially distributed beam.

The resulting blue beam passes through the optically coupled transmissive yellow phosphor plate 208 and part of the blue beam is converted to yellow. The output of the transmissive yellow phosphor plate 208 is a white light beam formed by the combination of the yellow light and the unconverted blue laser light. Condensing and collimating lenses 210 optically coupled to the transmissive yellow phosphor plate 208 to receive the white light beam capture the white light beam and condense and collimate the beam to form a collimated white light beam.

Referring now to FIG. 3, in this example, the excitation optics 300 and the condensing and collimating lenses 304 are as previously described for similarly named components of FIG. 2. The blue laser light source for the excitation optics 300 is not shown. The reflective yellow phosphor plate 302 is optically coupled to the excitation optics 300 to receive the shaped blue laser beam. The blue laser beam goes through the yellow phosphor and is reflected back, converting some of the blue laser light to yellow light, thus producing a white light beam as a combination of the unconverted blue laser light and the yellow light. The condensing and collimating lenses 304 capture the white light beam and form a collimated white light beam that is provided to the illumination optics.

Laser based illumination systems such as the above examples present several design challenges. Some challenges are briefly described here. More detail may be found, for example, in Schug. One such challenge is the design of the yellow phosphor plate. The amount of yellow light and blue light that is combined to get white light is controlled by this plate. If too much blue light is converted, the result will be a yellowish white light. If too little blue light is converted, the result will be a bluish white light. In addition, similar angular distribution for the converted yellow light and the unconverted blue light scattered through the phosphor is needed, which is difficult to achieve. Typically, converted yellow light will have Lambertian-like distribution whereas unconverted blue light distribution is dependent on the scattering through phosphor which is difficult to control. This blue light will have a specular component which makes it difficult to create a homogeneous white distribution over an angle.

Figure 4:
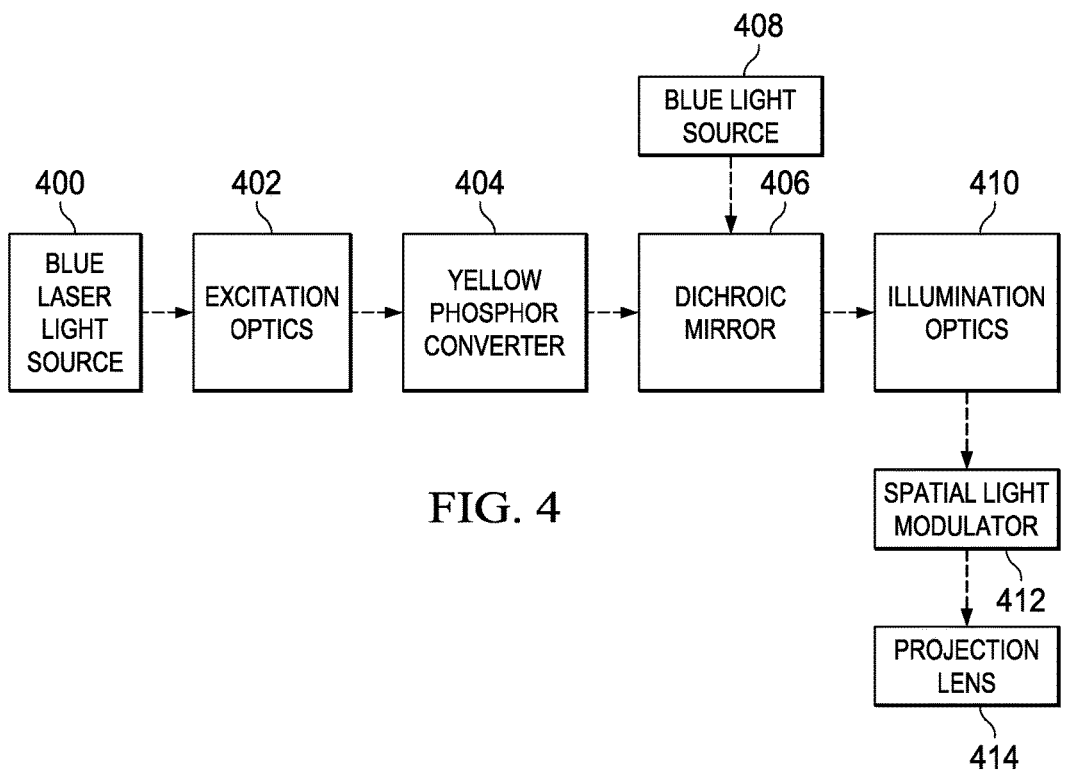
FIG. 4 shows an example high level architecture for a laser based headlamp.

Further, to achieve the desired high brightness needed for a headlight, a very high lumen white light beam is needed out of the yellow phosphor plate. Such a beam requires very high power on the yellow phosphor plate. Putting sufficient power on the yellow phosphor plate is another design challenge, as efficiency goes down when the power is increased due to thermal quenching. Further, if the yellow phosphor plate fails, the blue laser light will go through the phosphor plate without conversion and onto the road. Direct laser light at high power is not eye safe and thus affects the safety of oncoming drivers or others on the road Embodiments of the disclosure provide a hybrid illumination system for a headlamp designed to address these challenges. FIG. 4 shows an example high level architecture for a laser based headlamp with a hybrid illumination system. A blue laser light source 400 incorporating one or more blue laser diodes is optically coupled to excitation optics 402 to provide blue laser light. The number of blue laser diodes used may be based on factors such as brightness requirements, power consumption, the flux density capacity of the phosphor plate 508, and output power of the blue LED. The excitation optics 402 are optically coupled to the yellow phosphor converter 404 to provide a shaped blue laser light beam to the phosphor converter 404. Examples of excitation optics are described in reference to FIG. 5 and FIG. 6.

The yellow phosphor converter 404, which may be either reflective or transmissive, converts part of the blue beam to yellow and some remains blue. The yellow phosphor converter 404 may be, for example, a yellow phosphor plate of any suitable shape and size that is large enough to provide an étendue matched source area or a yellow phosphor wheel of any suitable size large enough to provide an étendue matched source area.

The net result is a light beam formed from a combination of converted yellow light and unconverted blue light. This phosphor-emitted light beam is provided to a dichroic mirror 406 optically coupled to the phosphor converter 404. In general, a dichroic mirror is a slab of glass that is coated to reflect particular wavelengths of light and to pass other wavelengths. The dichroic mirror 406 is designed to reflect the blue laser light in the combination light beam and pass only the yellow light. To form a white light beam, a blue light source 408 optically coupled to the dichroic mirror 406 provides a blue light beam that hits the dichroic mirror 406 and is reflected toward the illumination optics 410 along with the filtered yellow light beam, resulting in a white light beam. Any suitable blue light emitter with the spectrum needed to achieve white light when mixed with the yellow light beam may be used in the blue light source 408. For example, the blue light emitter may be a blue light emitting diode (LED) of a size that matches the étendue of the optical system. The input electrical power applied to the blue light emitter and the power applied to the blue laser diode(s) is set to control the proportion of blue light and yellow light in the white light beam.

The illumination optics 410 are optically coupled to the dichroic mirror 406 to receive the white light beam. The illumination optics 406 arrange the white light beam to properly illuminate the optically coupled spatial light modulator 412. The spatial light modulator 412 modulates the white light beam at the pixel level to generate an image that is communicated to the optically coupled projection lens 414. The projection lens 414, which is an imaging projection lens, captures the image and projects a larger image at some distance away. The illumination optics 406 and spatial light modulator 412 may be as previously described in reference to FIG. 1 for illumination optics 106 and spatial light modulator 108.

Figure 5:
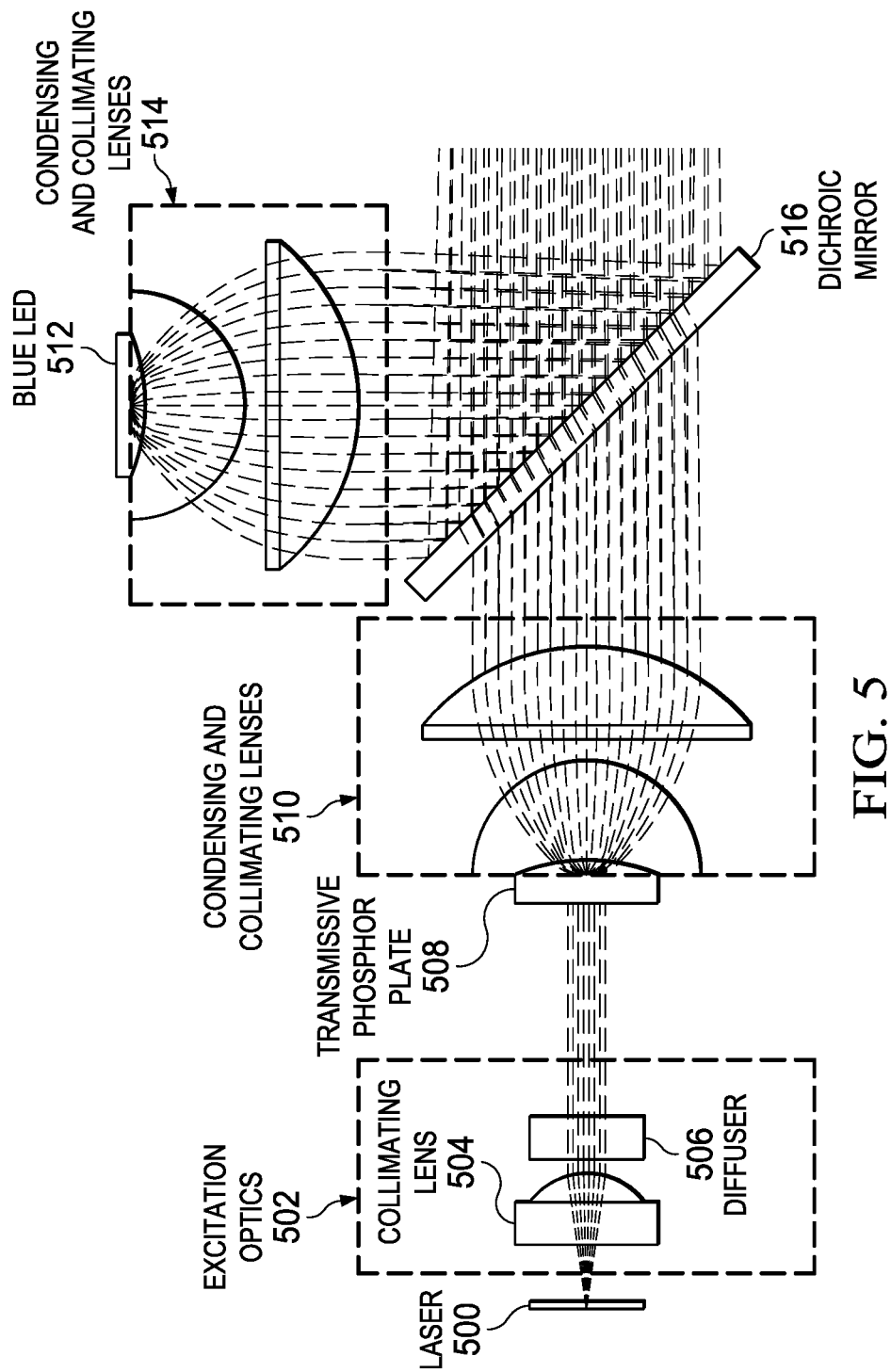
FIG. 5 is an example hybrid illumination system for a laser based headlamp that includes a transmissive yellow phosphor plate.
Figure 6:
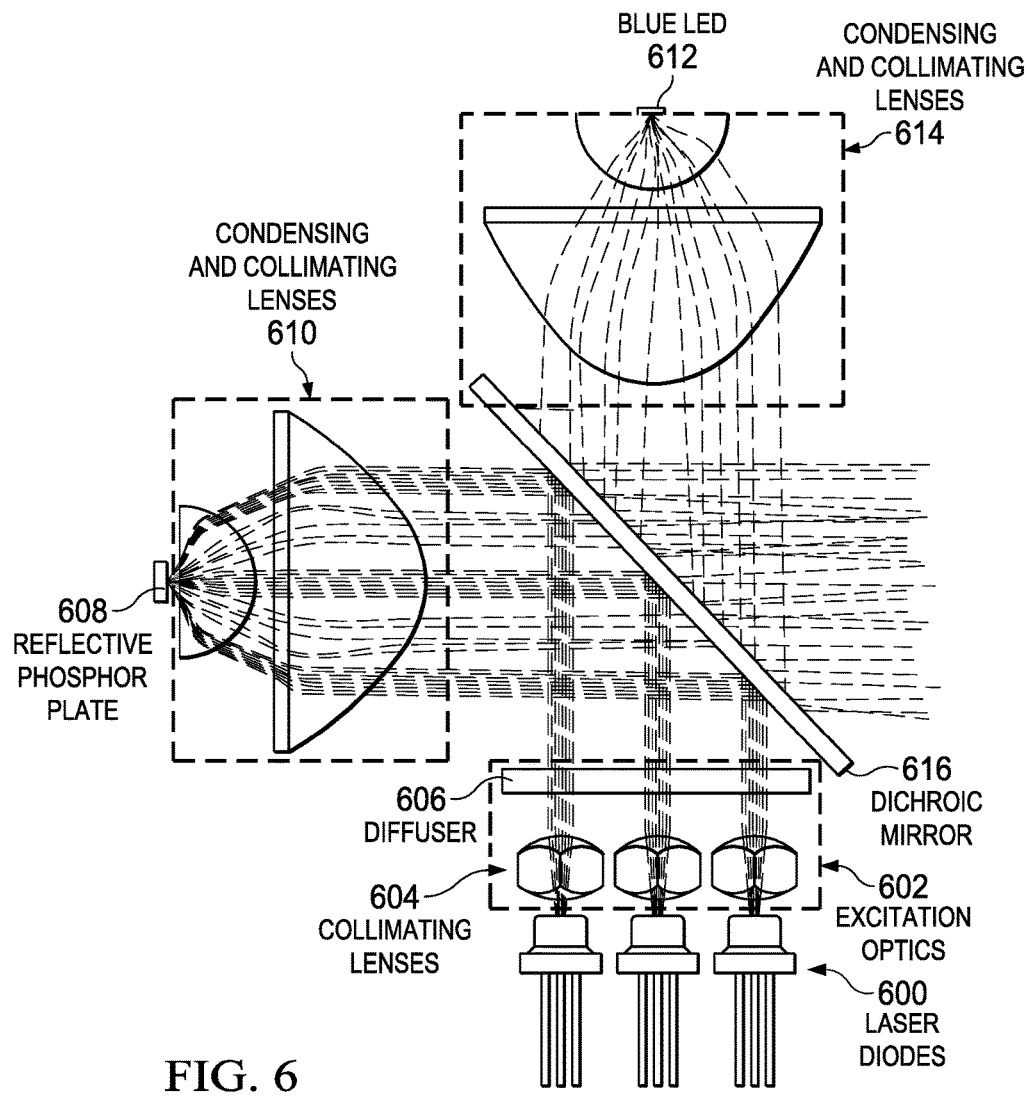
FIG. 6 is an example hybrid illumination system for a laser based headlamp that includes a reflective yellow phosphor plate.

FIG. 5 and FIG. 6 show example hybrid illumination systems that may be used in the laser based headlamp architecture of FIG. 4. Referring first to the example of FIG. 5, a blue laser diode 500 is optically coupled to excitation optics 502 to provide a blue laser light beam. The excitation optics 502 include a collimating lens 204 which receives and collimates the blue laser light beam emitted by the laser diode 500. The excitation optics 502 further include a beam shaper 506 implemented by an optical diffuser optically coupled to the collimating lens 504. The optical diffuser 506 receives collimated blue laser light from the collimating lens 204 and optically homogenizes the collimated blue laser light beam into a top hat spatially distributed beam.

The resulting shaped blue beam passes through the optically coupled transmissive yellow phosphor plate 508 and part of the blue beam is converted to yellow. The output of the transmissive yellow phosphor plate 508 is a light beam formed by the combination of the yellow light and the unconverted blue laser light. Condensing and collimating lenses 210 optically coupled to the transmissive yellow phosphor plate 508 to receive the phosphor-emitted light beam capture the phosphor-emitted light beam and condense and collimate the beam to form a collimated light beam.

The collimated phosphor-emitted light beam is provided to the dichroic mirror 516 optically coupled to the phosphor plate 508. As previously mentioned, the dichroic mirror 508 is designed to reflect the blue laser light in the combination light beam and pass only the yellow light, thus providing a dichroic-filtered light beam. To form the output white light beam, a blue light source optically coupled to the dichroic mirror 516 provides a collimated blue light beam that hits the dichroic mirror 516 and is reflected in the same direction as the dichroic-filtered light beam. The blue light source incorporates a blue LED 512 and collimating and condensing lenses 514 optically coupled to the blue LED 512 capture the blue light beam of the LED 512 and condense and collimate the beam to form the collimated blue light beam. The input electrical power applied to the blue LED and the power applied to the blue laser diode is set to control the proportion of blue light and yellow light in the white light beam.

Referring now to the example of FIG. 6, three blue laser diodes 600 are optically coupled to excitation optics 602 to provide blue laser light. The excitation optics 602 include a set of three collimating lenses 604 which receive and collimate the blue laser light beams emitted by respective laser diodes 600. The excitation optics 602 further include a beam shaper 606 implemented by an optical diffuser optically coupled to the collimating lenses 604. The optical diffuser 606 receives the collimated blue laser light beams from the collimating lenses 604 and optically homogenizes the collimated blue laser light beams into top hat spatially distributed beams.

The resulting shaped blue laser beams are reflected from the optically coupled dichroic mirror 616 toward the reflective yellow phosphor plate 610. The condensing and collimating lenses 610 are optically coupled to the dichroic mirror 616 to receive the reflected blue beams. The condensing and collimating lenses 608 collect the blue beams and form a collimated blue beam that is provided to the optically coupled reflective yellow phosphor plate 608. The collimated blue laser beam goes through the yellow phosphor and is reflected back, converting some of the blue laser light to yellow light, thus producing a light beam formed by a combination of the unconverted blue laser light and the yellow light. The condensing and collimating lenses 610 capture this phosphor-emitted light beam and form a collimated light beam.

The collimated light beam is provided to the dichroic mirror 616 which reflects the blue laser light in the light beam and passes only the yellow light, thus providing a dichroic-filtered light beam. To form the output white light beam, a blue light source optically coupled to the dichroic mirror 616 provides a collimated blue light beam that hits the dichroic mirror 616 and is reflected in the same direction as the dichroic-filtered light beam. The blue light source incorporates a blue LED 612 and collimating and condensing lenses 614 optically coupled to the blue LED 612 to capture the blue light beam of the LED 612 and condense and collimate the beam to form the collimated blue light beam. The input electrical power applied to the blue LED and the power applied to the blue laser diodes is set to control the proportion of blue light and yellow light in the white light beam.

The architecture of the above described hybrid illumination systems is intrinsically eye safe as even if the phosphor plate fails, the dichroic mirror will not allow any of the blue laser light to pass out of the system. The use of the optical diffuser in the laser illumination path also reduces thermal quenching. Further, the white light beam output by a hybrid system is generated by blue light from the blue light source and yellow light from the phosphor converter. The amount of blue light can be controlled by changing the current on the blue light emitter, e.g., a blue LED, and the amount of yellow light can be controlled by changing the current on the blue laser(s). In other words, the proportion of blue and yellow light can be adjusted, thus lessening the design constraints on the yellow phosphor plate.

In addition, because the unconverted blue laser light is not used to generate the final white light beam, the yellow phosphor does not need to be fine tuned to convert a precise amount of yellow light and yield a proportionate amount of unconverted blue light. The yellow phosphor converter may be optimized to convert most of the blue light into yellow light. Such a yellow optimized phosphor converter may yield more efficient yellow light as compared to a white optimized phosphor converter. If a blue LED is used as the emitter in the blue light source, both the converted yellow light and the blue light from the blue light source have Lambertian type angular distribution which helps control the angular homogeneity of the resulting white beam. In addition, because most of the blue light needed to form the output white light is provided by the blue light source rather than by the phosphor converter as in FIGS. 1-3, the blue light power used to excite the phosphor converter in the hybrid illumination systems can be less than that needed to excite the phosphor converter in FIGS. 1-3, which helps reduce the overall thermal load.

Figure 7:
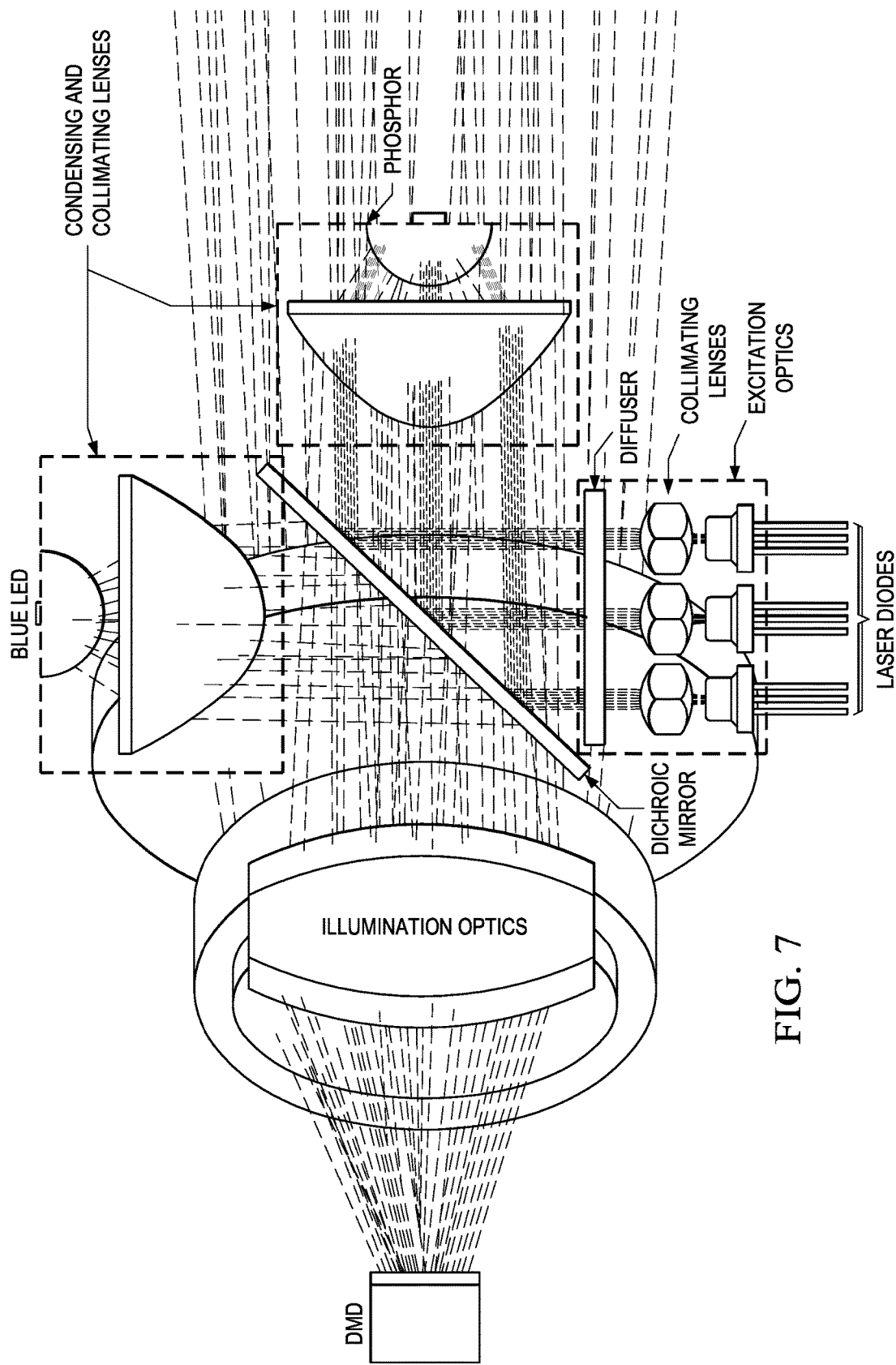
FIGS. 7 and 8 show perspective views of an example headlamp architecture incorporating an embodiment of the hybrid illumination system of FIG. 6.
Figure 8:
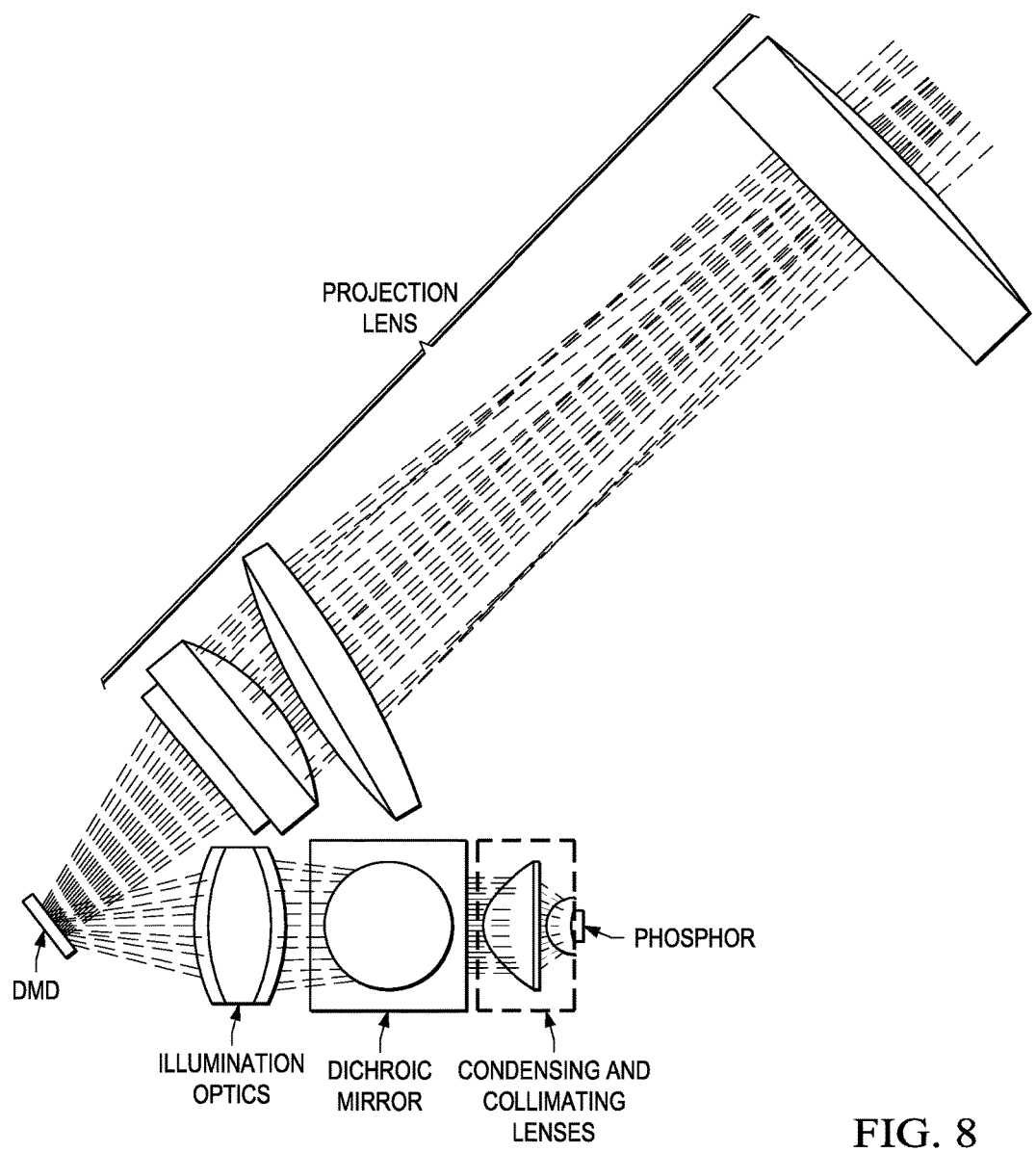

FIG. 7 and FIG. 8 show perspective views of an example headlamp architecture incorporating an embodiment of the hybrid light system of FIG. 6. This example architecture uses a DMD for the spatial light modulator which may be any DMD suitable for use in a headlamp such as, for example, the 0.3-inch wide video graphics array (WVGA) DMD available from Texas Instruments Incorporated.

Figure 9:
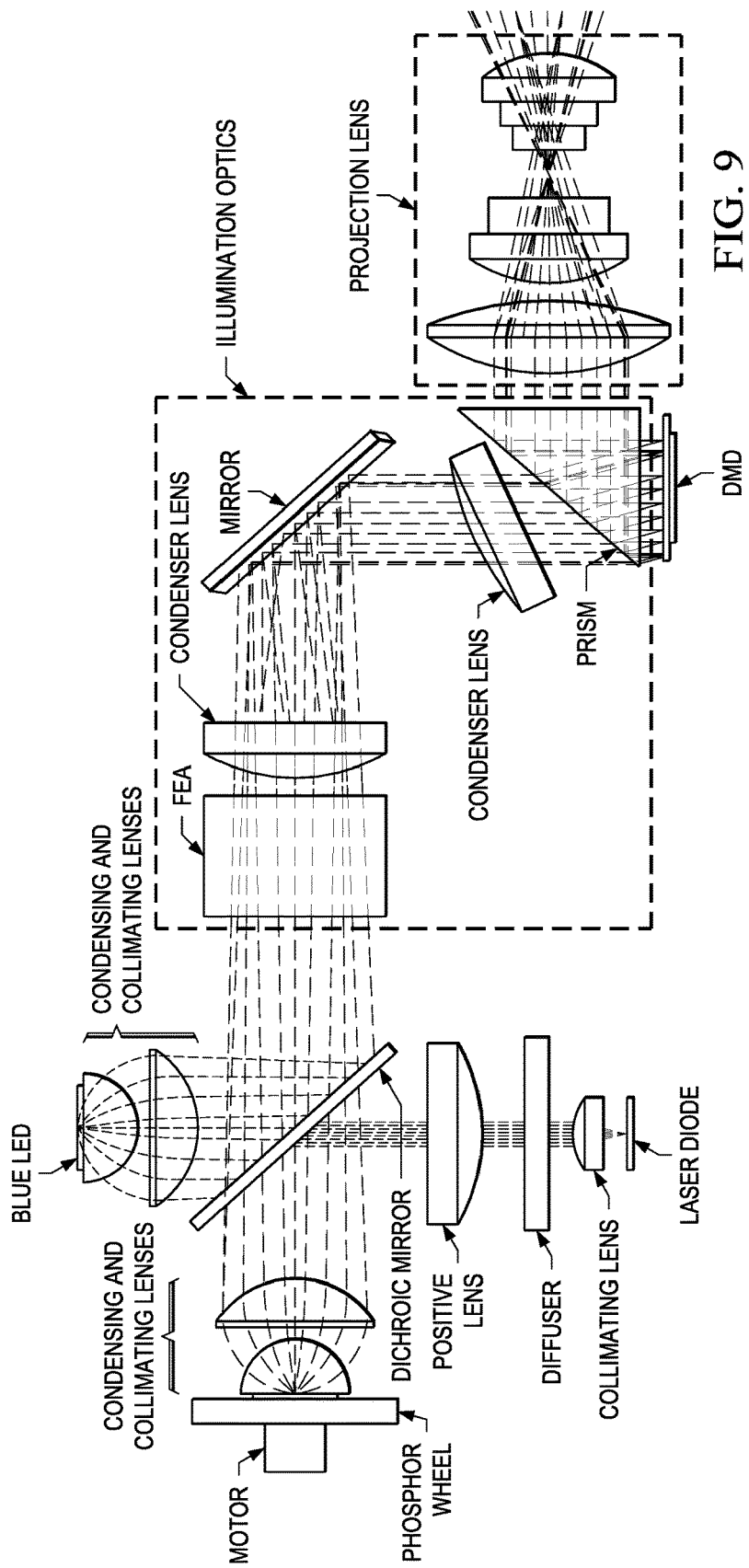
FIG. 9 shows an example headlamp architecture incorporating an embodiment of a hybrid illumination system.

FIG. 9 shows an example headlamp architecture incorporating an embodiment of a hybrid light system. In the depicted embodiment, the yellow phosphor converter is a yellow phosphor wheel mounted on a motor. Use of the rotating wheel helps improve thermal performance by ensuring that no one portion of the phosphor is constantly exposed to very high incident light. Further, the wheel rotation helps with air flow and cooling of the phosphor. This example architecture uses a DMD for the spatial light modulator which may be any DMD suitable for use in a headlamp such as, for example, the 0.3-inch wide video graphics array (WVGA) DMD available from Texas Instruments Incorporated.

The illumination optics include the fly's eye array (FEA) optically coupled to the mirror, which is in turn optically coupled to the prism. A fly's eye array is a two dimensional array of individual optical elements assembled or formed into a single optical element and used to spatially transform light from a non-uniform distribution to a uniform distribution at an illumination plane. In this example, the FEA serves to improve blue and yellow color uniformity in the white light beam. The white light beam from the dichroic mirror passes through the FEA and is condensed by the optically coupled condenser lens. The mirror reflects the condensed white light from the FEA to form a semi-collimated white light beam that is condensed by the condenser lens optically coupled to the prism. The prism, which may be a total internal-reflectance-prism, separates the illumination path to the DMD from the projection path from the DMD to the projection lens.

Figure 10:
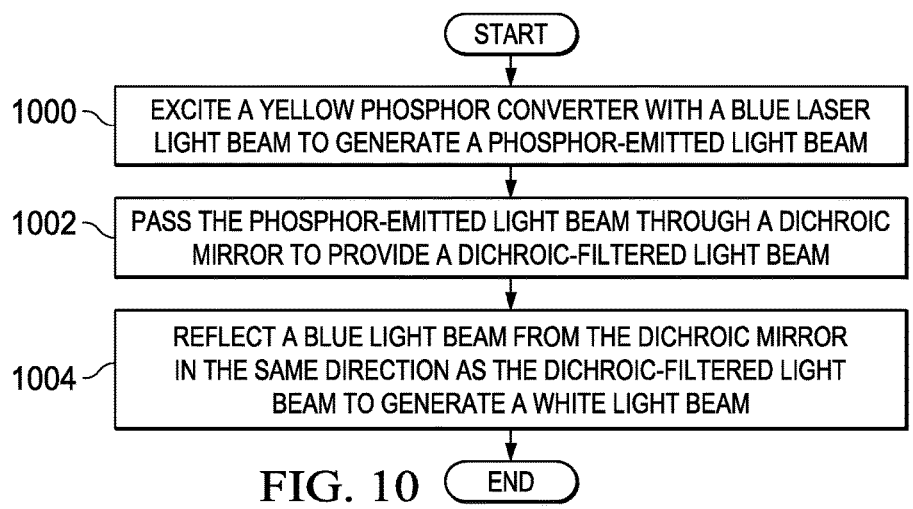
FIG. 10 is a flow diagram of a method for generating a white light beam in a hybrid illumination system.

FIG. 10 is a flow diagram of a method for generating a white light beam in a hybrid illumination system such as those described herein. The various components of a hybrid illumination system mentioned in this description are previously described herein. To generate the desired white light, a yellow phosphor converter is excited 1000 by a blue laser light beam to generate a phosphor-emitted light beam. In some embodiments, the blue laser light beam is collimated and shaped by a beam shaper such as a diffuser. The yellow phosphor converter converts at least some of the blue light of the blue laser light beam to yellow light in the phosphor-emitted light beam.

The phosphor-emitted light beam is passed 1102 through a dichroic mirror to generate a dichroic-filtered light beam. In some embodiments, the phosphor-emitted light beam is condensed and collimated before passing through the dichroic mirror. The dichroic mirror is designed to transmit any yellow light in the phosphor-emitted light beam in the dichroic transmitted light beam and to reflect any unconverted blue light in the phosphor-emitted light beam. A blue light beam from a blue light source is reflected 1104 from the dichroic mirror in the same direction as the dichroic-filtered light beam to form the white light beam.

Other Embodiments

Embodiments have been described in which an optical diffuser is used to generate the shaped blue beams, but other embodiments are possible in which another suitable beam shaper is used, such as an analytical aspheric lens or a light pipe. Further, other embodiments are possible in which beam shapes other than top hat, e.g., Gaussian, are used.

In another example, embodiments have been described in which the excitation optics include one or more collimating lenses and a beam shaper, but other embodiments are possible in which the excitation optics differ. For example, a tapered tunnel may be used. Further, other embodiments are possible in which excitation optics are not used, and the blue laser light is shone directly on the yellow phosphor converter without any intermediate optics.

In another example, embodiments have been described in which the blue light source includes condensing and collimating lenses, but other embodiments are possible in which the condensing and collimating lenses are replaced by a tapered tunnel.

In another example, the dichroic mirror is designed to pass some of the unconverted blue light in the phosphor-emitted light beam. The amount of blue light transmitted may be limited by eye safety limits. The total amount of blue light used to form the white light may be controlled, such as by the amount of current on the blue light emitter in the blue light source.

In another example, the yellow phosphor converter converts the blue laser light such that no blue light remains unconverted.

In another example, more than one blue LED is used in the blue light source.

Modifications are possible in the described embodiments, and other embodiments are possible, within the scope of the claims.

What is claimed is:

1. An apparatus comprising:
a first blue light source configured to provide a first blue light beam, the first blue light source being a blue laser light source, and the first blue light beam being a blue laser light beam;
a collimating lens, optically coupled to the first blue light source, configured to collimate the first blue light beam into a collimated blue light beam;
an optical diffuser, optically coupled to the collimating lens, configured to optically homogenize the collimated blue light beam into a top hat spatially distributed beam;
a yellow phosphor converter configured to convert the top hat spatially distributed beam into a phosphor-emitted light beam, at least a majority of the phosphor-emitted light beam being yellow light converted from blue light of the top hat spatially distributed beam;
condensing and collimating lenses, optically coupled to the yellow phosphor converter, configured to condense and collimate the phosphor-emitted light beam into a condensed and collimated phosphor-emitted light beam;
a dichroic mirror, optically coupled to the condensing and collimating lenses, configured to filter the condensed and collimated phosphor-emitted light beam into a dichroic-filtered light beam passed by the dichroic mirror, including by passing yellow light and reflecting at least some blue light; and
a second blue light source, optically coupled to the dichroic mirror, configured to provide a second blue light beam, the dichroic mirror configured to reflect the second blue light beam in a same direction as the dichroic-filtered light beam to generate a white light beam.

2. The apparatus of claim 1, wherein the yellow phosphor converter is one selected from a group consisting of a yellow phosphor plate and a yellow phosphor wheel.

3. The apparatus of claim 1, wherein the second blue light source includes a blue light emitting diode.

4. The apparatus of claim 1, wherein a portion of the phosphor-emitted light beam is unconverted blue laser light.

5. The apparatus of claim 1, wherein the dichroic mirror is configured to reflect all blue light.

6. The apparatus of claim 1, wherein the apparatus is a component of a headlamp.

7. The apparatus of claim 1, wherein the phosphor-emitted light beam has a same direction as the top hat spatially distributed beam.

8. A headlamp, comprising:
a first blue light source configured to provide a first blue light beam, the first blue light source being a blue laser light source, and the first blue light beam being a blue laser light beam;
a collimating lens, optically coupled to the first blue light source, configured to collimate the first blue light beam into a collimated blue light beam;
an optical diffuser, optically coupled to the collimating lens, configured to optically homogenize the collimated blue light beam into a top hat spatially distributed beam;
a yellow phosphor converter configured to convert the top hat spatially distributed beam into a phosphor-emitted light beam, at least a majority of the phosphor-emitted light beam being yellow light converted from blue light of the top hat spatially distributed beam;
condensing and collimating lenses, optically coupled to the yellow phosphor converter, configured to condense and collimate the phosphor-emitted light beam into a condensed and collimated phosphor-emitted light beam;
a dichroic mirror, optically coupled to the condensing and collimating lenses, configured to filter the condensed and collimated phosphor-emitted light beam into a dichroic-filtered light beam passed by the dichroic mirror, including by passing yellow light and reflecting at least some blue light; and
a second blue light source, optically coupled to the dichroic mirror, configured to provide a second blue light beam, the dichroic mirror configured to reflect the second blue light beam in a same direction as the dichroic-filtered light beam to generate a white light beam;
a spatial light modulator configured to modulate the white light beam at a pixel level to generate an image;
illumination optics, optically coupled between the dichroic mirror and the spatial light modulator, the illumination optics configured to illuminate the spatial light modulator with the white light beam; and
projection optics, optically coupled to the spatial light modulator, configured to receive the generated image and project a larger version of the generated image at a distance away from the headlamp.

9. The headlamp of claim 8, wherein the spatial light modulator is a digital micromirror device.

10. The headlamp of claim 8, wherein the yellow phosphor converter is one selected from a group consisting of a yellow phosphor plate and a yellow phosphor wheel.

11. The headlamp of claim 8, wherein a portion of the phosphor-emitted light beam is unconverted blue laser light.

12. The headlamp of claim 8, wherein the dichroic mirror is configured to reflect all blue light.

13. The headlamp of claim 8, wherein the phosphor-emitted light beam has a same direction as the top hat spatially distributed beam.

14. A method comprising:
providing a first blue light beam, the first blue light beam being a blue laser light beam;
with a collimating lens, collimating the first blue light beam into a collimated blue light beam;
with an optical diffuser, optically homogenizing the collimated blue light beam into a top hat spatially distributed beam;
with a yellow phosphor converter, converting the top hat spatially distributed beam into a phosphor-emitted light beam, at least a majority of the phosphor-emitted light beam being yellow light converted from blue light of the top hat spatially distributed beam;
condensing and collimating the phosphor-emitted light beam into a condensed and collimated phosphor-emitted light beam;
with a dichroic mirror, filtering the condensed and collimated phosphor-emitted light beam into a dichroic-filtered light beam passed by the dichroic mirror, including by passing yellow light and reflecting at least some blue light;
providing a second blue light beam; and
with the dichroic mirror, reflecting the second blue light beam in a same direction as the dichroic-filtered light beam to generate a white light beam.

15. The method of claim 14, wherein the phosphor-emitted light beam has a same direction as the top hat spatially distributed beam.

* * * * *